United States Patent [19]
Park

[11] Patent Number: 5,714,753
[45] Date of Patent: Feb. 3, 1998

[54] SOLID STATE IMAGING DEVICE

[75] Inventor: Sang-sik Park, Kyungki-do, Rep. of Korea

[73] Assignee: Samsung Electronics Co., Ltd., Kyungki-do, Rep. of Korea

[21] Appl. No.: 758,045

[22] Filed: Nov. 27, 1996

[30] Foreign Application Priority Data

Nov. 29, 1995 [KR] Rep. of Korea ............... 95-44907

[51] Int. Cl.$^6$ ............................................. H01J 40/14
[52] U.S. Cl. ................... 250/208.1; 250/214 R; 348/297; 257/448
[58] Field of Search ................ 250/208.1, 214 R, 250/214.1, 214 L; 348/297, 298, 315; 327/187, 515; 257/448, 450, 451

[56] References Cited

U.S. PATENT DOCUMENTS 5,648,654  7/1997  Possin ..................... 250/208.1

Primary Examiner—Que Le
Attorney, Agent, or Firm—Myers Bigel Sibley & Sajovec, L.L.P.

[57] ABSTRACT

A solid state imaging device includes a light receiving portion having a first photodiode and a second photodiode whose potential well is deeper and whose photosensitivity is lower than that of the first photodiode, and a transmitting portion having a first transmitting gate for transmitting charges accumulated in the first photodiode to a transmission device and a second transmitting gate for transmitting charges accumulated in the second photodiode to the transmission device. Thus, the dynamic range of the solid state imaging device becomes wider.

4 Claims, 3 Drawing Sheets

SOLID STATE IMAGING DEVICE

BACKGROUND OF THE INVENTION

The present invention relates to a semiconductor device, and more particularly, to a solid state imaging device whose light receiving portion is comprised of two photodiodes.

A charge coupled device (CCD) type solid state imaging device is largely divided into a light receiving portion, a transmitting portion, and an outputting portion.

FIG. 1 is a plan view schematically illustrating a light receiving portion and a transmitting portion of a conventional solid state imaging device.

The unit light receiving portion is comprised of photodiode 12, and the transmitting portion is comprised of transmitting gates 18, a channel layer 10, and first and second gate electrodes 14 and 16.

The photodiode 12 receive light from an external light source and convert the same into charges. The transmitting gates 18 transmit the charges accumulated in the photodiode 12 to the channel layer 10. The charges transmitted to the channel layer 10 are transferred in a predetermined direction by clock signal pulses applied to the first and second gate electrodes 14 and 16.

In that case, if light exceeding the saturation illumination is received in the photodiode 12, charges generated from the excess are drained by an overflow drain (OFD) operation. Thus, the amount of charges transmitted to the channel layer 10 are always at a constant level (saturation level). Therefore, since the same outputs are generated for the light exceeding the saturation illumination and the information exceeding the saturation illumination is not given to the channel layer, the dynamic range of a solid state imaging device is limited.

FIG. 2 is a graph showing the outputs depending on the intensity of illumination of the conventional solid state imaging device.

The graph of FIG. 2 shows that, even if light exceeding the saturation illumination is received, the signal exceeding the saturation level is not transmitted to the channel layer.

If the saturation illumination is increased by increasing the capacitance of the photodiode, the handling capacity of the transmitting gates becomes restricted.

SUMMARY OF THE INVENTION

It is an object of the present invention to provide a solid state imaging device which exhibits high sensitivity with outputs having a sharp slope at low intensity illumination, and extends the dynamic range of the solid state imaging device with outputs having a dull slope at high intensity illumination.

To accomplish the object of the present invention, there is provided a solid state imaging device comprising: a light receiving portion having a first photodiode and a second photodiode whose potential well is deeper and whose photosensitivity is lower than that of said first photodiode; and a transmitting portion having a first transmitting gate for transmitting charges accumulated in the first photodiode to a transmission device and a second transmitting gate for transmitting charged accumulated in the second photodiode to the transmission device.

According to the solid state imaging device of the present invention, it is preferable that the concentration of impurity ions doped into the second photodiode is higher than that of impurity ions doped into the first photodiode.

Also, it is preferable that the second photodiode is smaller than the first photodiode.

Therefore, according to the solid state imaging device of the present invention, the outputs are increased depending on the intensity of light with less sensitivity at an illumination level which is higher than the saturation illumination, thereby widening the dynamic range of the sold state imaging device.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Hereinbelow, detailed embodiments of the present invention will be described with reference to accompanying drawings.

Figure 1:
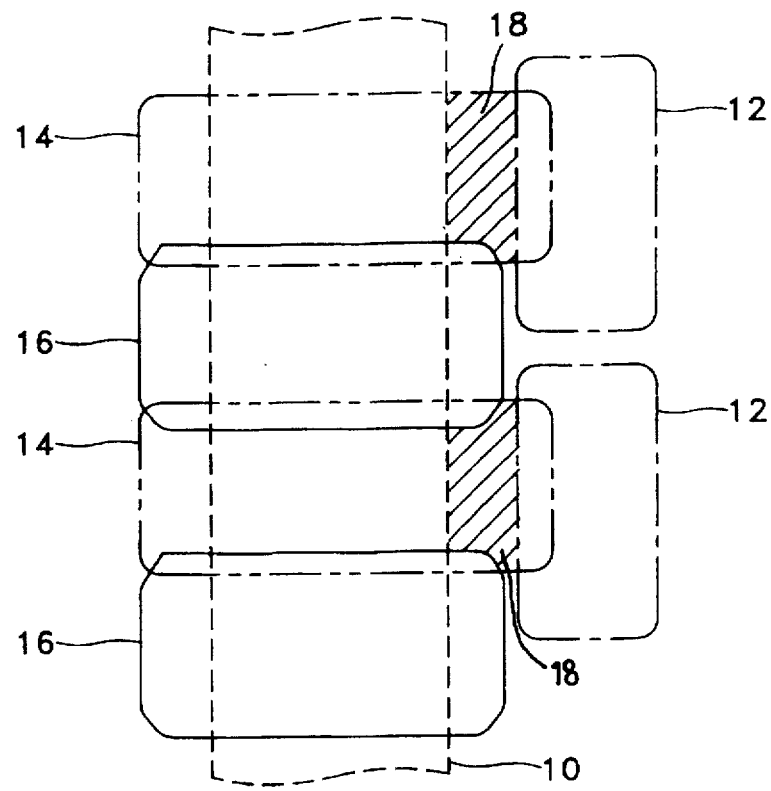
FIG. 1 is a plan view schematically illustrating a light receiving portion and a transmitting portion of a conventional solid state imaging device.
Figure 2:
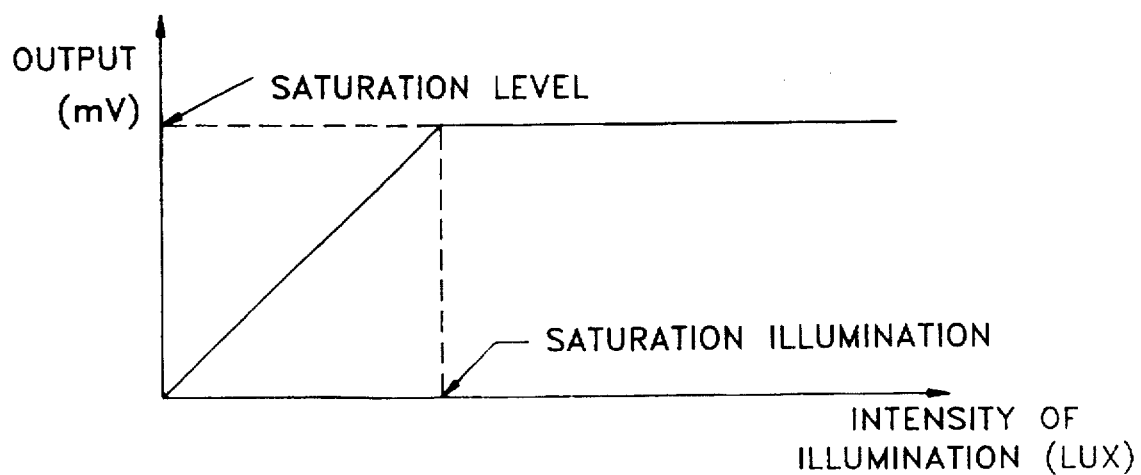
FIG. 2 is a graph showing the outputs depending on the intensity of illumination of the conventional solid state imaging device.
Figure 3:
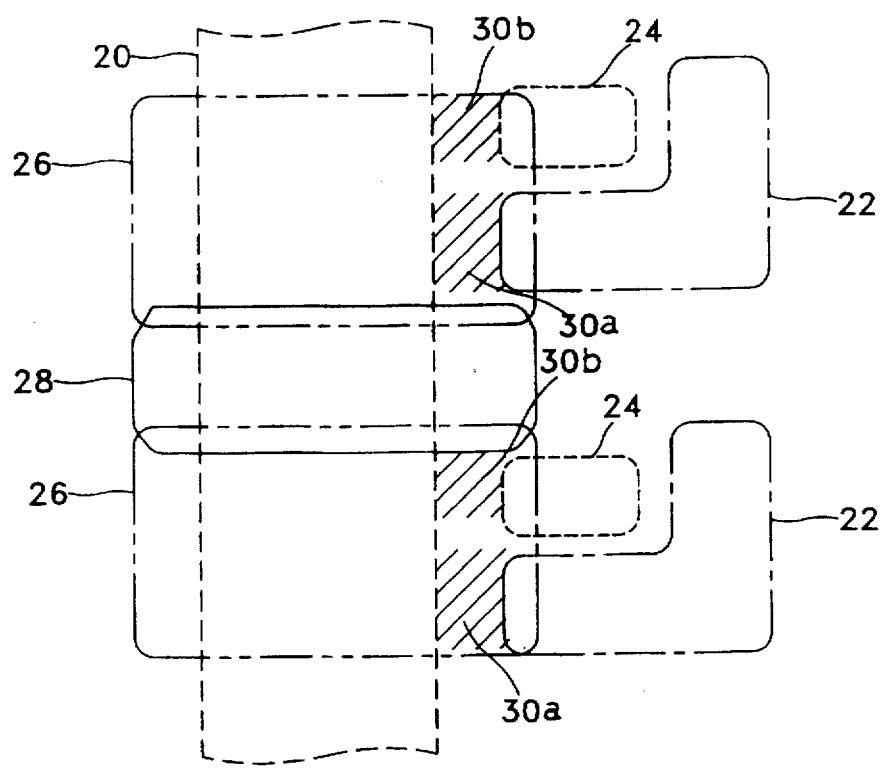
FIG. 3 is a plan view schematically illustrating a light receiving portion and a transmitting portion of a solid state imaging device according to the present invention.

FIG. 3 is a plan view schematically illustrating a light receiving portion and a transmitting portion of a solid state imaging device according to the present invention.

The solid state imaging device according to the present invention is largely comprised of a light receiving portion, a transmitting portion, and an outputting portion, as in the conventional device. However, the outputting portion is not shown in FIG. 3.

First, the light receiving portion includes a first photodiode 22 and a second photodiode 24 having a deeper potential well and receiving a smaller amount of light per unit area than that of the first photodiode 22.

The second photodiode 24 is smaller than the first photodiode 22, and the concentration of impurities doped into the second photodiode 24 is higher than that of the first photodiode 22.

An on-chip microlens is adjusted to be focused on the first photodiode 22 so that the amount of light received in the second photodiode 24 is smaller than that of light received in the first photodiode 22.

The transmitting portion includes a first transmitting gate 30a for transmitting charges accumulated in the first photodiode 22 into a channel layer 20, a second transmitting gate 30b for transmitting charges accumulated in the second photodiode 24 into the channel layer 20, the channel layer 20 for transferring the charges being transmitted from the first and second photodiodes 22 and 24 in a predetermined direction, and first and second gate electrodes 26 and 28 to which clock signal pulses are applied for transferring the charges.

The operational principle of a solid state imaging device according to the present invention will now be described.

Case when less light is receved than the saturation illumination

Figure 4:
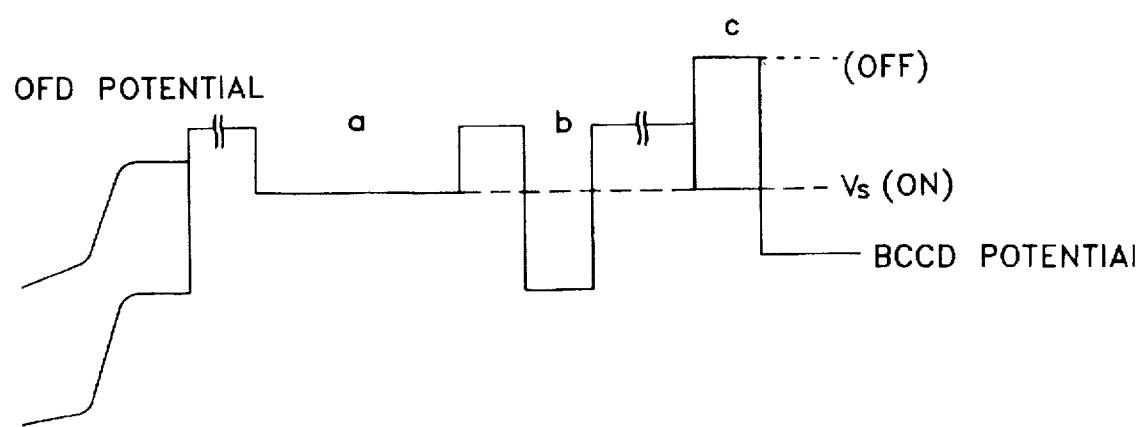
FIG. 4 shows the distribution of potentials of the light receiving portion and the transmitting portion of the solid state imaging device according to the present invention.

FIG. 4 shows the distribution of potentials of the light receiving portion and the transmitting portion of the solid state imaging device according to the present invention, in case when less light is received than the saturation illumination.

In FIG. 4, reference character "a" denotes a potential well of the first photodiode (22 of FIG. 3), reference character "b" denotes a potential well of the second photodiode (24 of FIG. 3), and reference character "c" denotes a potential well of the first and second transmitting gates 30a and 30b.

Even if charges are generated at the second photodiode 24, the charges cannot pass through the second transmitting gate 30b since the potential of the potential well (b) is lower than the potential (Vs) of an "on" state of the second transmitting gate 30b. In other words, no signal is generated from the second photodiode 24 even with a field shift, which is called "image lag", so that the charges do not contribute to the output signals.

The charges accumulated in the second photodiode 24 are removed for each field by the operation of an electronic shutter of the OFD. Thus, only the charges generated from the first photodiode 22 contribute the outputs (f of FIG. 5).

Case when more light is received than the saturation illumination

Figure 5:
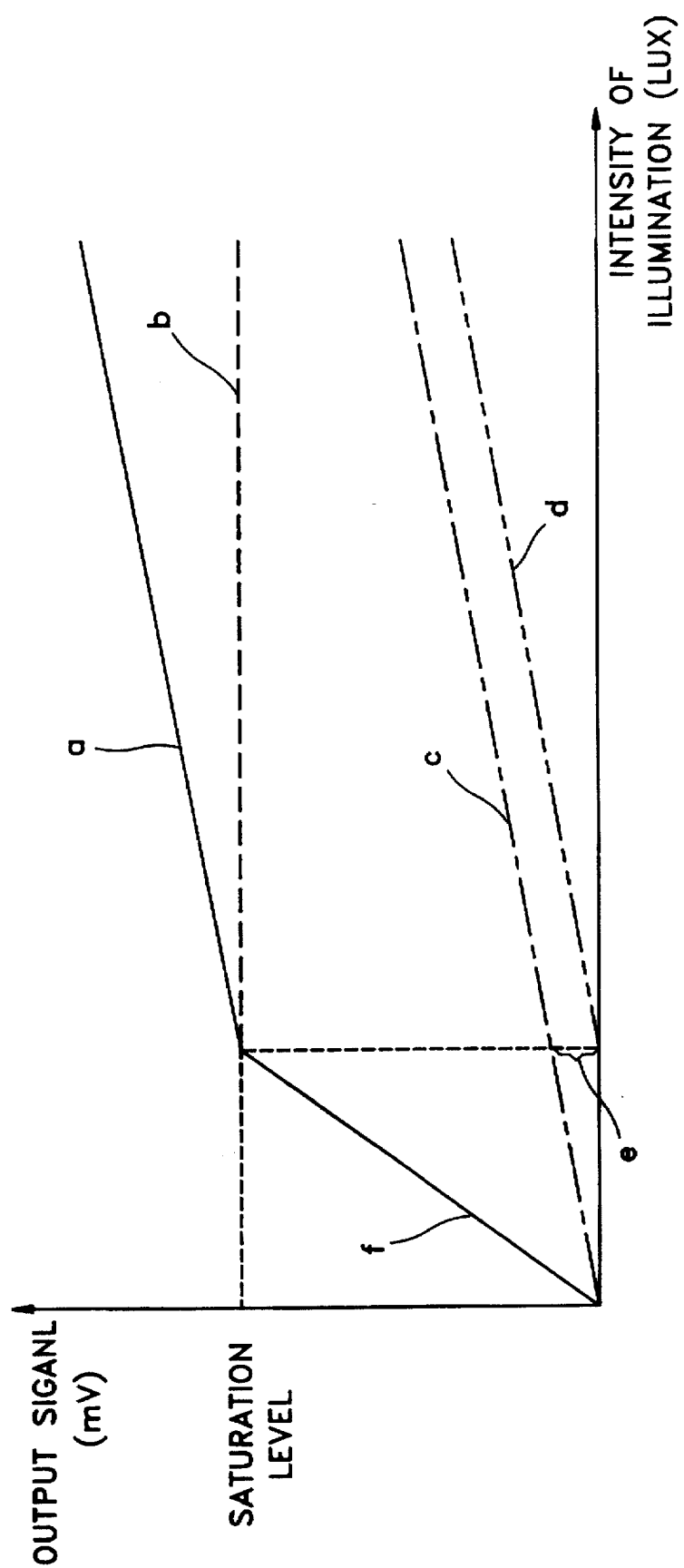
FIG. 5 is a graph showing the outputs depending on the intensity of illumination of the solid state imaging device according to the present invention.

The first photodiode 22 is saturated to output a saturated signal (b of FIG. 5). In other words, the first photodiode 22 does not output information exceeding the saturation level. However, the second photodiode 24 continue to generate charges so that the potential the potential well of the second photodiode 24 is higher than the potential (Vs) of an "on" state of the second transmitting gate 30b.

When field-shift is undertaken, the charges accumulated in the potential well having potential lower than the potential of the "on" state transmitting gate remain in the second photodiode 24 to be discharged to the OFD, and only surplus charges are transmitted to the channel layer 20 via the transmitting gate. The surplus charges reveal the intensity llumination higher than the saturation illumination.

Therefore, the total amount of signals transmitted to the channel layer 20 is obtained by adding the saturated signal of the first photodiode 22 and the amount exceeding the saturation illumination (a of FIG. 5).

FIG. 5 is a graph showing the outputs depending on the intensity of illumination of the solid state imaging device according to the present invention.

Reference character "a" denotes charges actually transmitted to the channel layer 20, reference character "b" denotes charges saturated in the first photodiode 22, reference character "c" denotes charges generated in the second photodiode 24, reference character "d" denotes charges transmitted from the second photodiode 24, reference character "e" denotes charges remaining in the second photodiode 24, and reference character "f" denotes charges generated in the first photodiode 22 and transmitted to the channel layer 20.

Therefore, in the solid state imaging device according to the present invention, since the amount of the light received in the second photodiode is small, the slope of outputs depending on the intensity of illumination is diminished at a portion higher than the saturation illumination. Thus, since the information exceeding the saturation illumination is displayed without exceeding the capacitance of a transmitting port, the dynamic range of the solid state imaging device becomes wider.

The present invention is not limited to the aforementioned embodiment and various changes and modifications may be effected by one skilled in the art within the scope of the invention.

What is claimed is:

1. A solid state imaging device comprising:

a light receiving portion having a first photodiode and a second photodiode whose potential well is deeper and whose photosensitivity is lower than that of said first photodiode; and a transmitting portion having a first transmitting gate for transmitting charges accumulated in said first photodiode to a transmission device and a second transmitting gate for transmitting charged accumulated in said second photodiode to said transmission device.

2. A solid state imaging device as claimed in claim 1, wherein the concentration of impurity ions doped into said second photodiode is higher than that of impurity ions doped into said first photodiode.

3. A solid state imaging device as claimed in claim 1, wherein said second photodiode is smaller than said first photodiode.

4. A solid state imaging device as claimed in claim 1, further comprising:

a microlens formed so that the focus thereof is adjusted to said first photodiode.

* * * * *